(12) United States Patent
 Alldred et al.

(10) Patent No.: US 9,054,731 B2
(45) Date of Patent: Jun. 9, 2015

(54) INTEGRATOR OUTPUT SWING REDUCTION

(71) Applicant: ANALOG DEVICES TECHNOLOGY, Hamilton (BM)

(72) Inventors: David Nelson Alldred, Toronto (CA); Jipeng Li, Windham, NH (US); Richard E. Schreier, Toronto (CA); Hajime Shibata, Toronto (CA)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 14/073,396

(22) Filed: Nov. 6, 2013

(65) Prior Publication Data

US 2015/0123828 A1 May 7, 2015

(51) Int. Cl.
 *H03M 3/00* (2006.01)
 *H03M 1/18* (2006.01)

(52) U.S. Cl.
 CPC .............. *H03M 3/376* (2013.01); *H03M 1/183* (2013.01)

(58) Field of Classification Search
 CPC ..... H03M 3/454; H03M 3/464; H03M 3/458; H03M 3/368; H03M 3/372; H03M 3/344; H03M 3/37; H03M 3/374; H03M 3/39; H03M 3/30; H03M 3/322
 USPC .................. 341/118, 120, 143, 155
 See application file for complete search history.

(56) References Cited

U.S. PATENT DOCUMENTS

| | | | |
|---|---|---|---|
| 5,283,578 A * | 2/1994 | Ribner et al. ................. | 341/143 |
| 6,809,672 B2 * | 10/2004 | Gupta ........................... | 341/143 |
| 6,930,624 B2 * | 8/2005 | Hezar et al. .................. | 341/143 |
| 7,567,193 B2 * | 7/2009 | Ryu ............................. | 341/143 |
| 7,893,855 B2 * | 2/2011 | Huang .......................... | 341/143 |
| 7,983,640 B2 * | 7/2011 | Doerrer ........................ | 455/230 |
| 8,223,050 B2 * | 7/2012 | Matsumoto et al. .......... | 341/131 |
| 8,223,053 B2 * | 7/2012 | Deval et al. ................... | 341/143 |
| 2005/0052299 A1 * | 3/2005 | Oliaei ........................... | 341/143 |
| 2008/0062022 A1 * | 3/2008 | Melanson ..................... | 341/143 |
| 2008/0136693 A1 * | 6/2008 | Kim et al. ..................... | 341/143 |
| 2008/0272946 A1 * | 11/2008 | Melanson ..................... | 341/143 |
| 2010/0283648 A1 | 11/2010 | Niwa et al. | |
| 2012/0075133 A1 * | 3/2012 | Guinea Trigo et al. ....... | 341/143 |

(Continued)

FOREIGN PATENT DOCUMENTS

WO    2012/100106    7/2012

OTHER PUBLICATIONS

Shanthi Pavan et al., "Power Reduction in Continuous-Time Delta-Sigma Modulators Using the Assisted Opamp Technique," IEEE Journal of Solid-State Circuits, vol. 45, No. 7, Jul. 2010, pp. 1365-1379.
Sunwoo Kwan et al., "Op-Amp Swing Reduction in Sigma-Delta Modulators," 0-7803-8251-X/04, © 2004 IEEE, ISCAS 2004, pp. I-525-I-528.

(Continued)

*Primary Examiner* — Linh Nguyen
(74) *Attorney, Agent, or Firm* — Patent Capital Group

(57) ABSTRACT

In one example implementation, the present disclosure provides a loop filter for use in a continuous-time sigma-delta analog-to-digital converter. Specifically, a capacitive feedback digital-to-analog converter path is provided at the input of a first opamp in a series of opamp integrators. The capacitive feedback digital-to-analog converter at the input of the first opamp reduces the signal content at the output of the first opamp, and thereby reduces the output swing of the first opamp. A reduction in output swing provides a more efficient loop filter.

19 Claims, 2 Drawing Sheets

(56) References Cited

U.S. PATENT DOCUMENTS

2012/0200437 A1     8/2012    Moue
2013/0021184 A1*   1/2013    Ashburn et al. ............... 341/143

OTHER PUBLICATIONS

Hajime Shibata et al., "A DC-to-1 GHz Tunable RF Delta-Sigma ADC Achieving DR=74 dB and BW=150 MHz at $f_0$=450 MHz Using 550 mW," 0018-9200 © 2012 IEEE, pp. 2888-2897.

U.S. Appl. No. 13/937,627, filed Jul. 9, 2013 entitled, "Integrator Output Swing Reduction Technique for Sigma-Delta Analog-to-Digital Converters," 15 pages.

Extended European Search Report issued in EP Patent Application U.S. Appl. No. 14188443.7 mailed Apr. 17, 2015, 16 pages.

Lundberg, Kent H., "International and External Op-Amp Compensation: A Control-Centric Tutorial", American Control Conference, 2004, Proceedings of the 2004 Boston, MA, USA Jun. 30-Jul. 2, 2004, Piscataway, NJ, USA, IEEE, Section IV, Appendix V, 15 pages.

\* cited by examiner

US 9,054,731 B2

INTEGRATOR OUTPUT SWING REDUCTION

TECHNICAL FIELD OF THE DISCLOSURE

The present disclosure relates generally to reducing output swing and, more particularly, to reducing integrator output swing in sigma-delta analog-to-digital converters.

BACKGROUND

Analog-to-digital converters (ADCs) based on sigma-delta modulation have been widely used in digital audio and high precision instrumentation systems. More recently, with the rising of continuous-time sigma-delta modulator being used in nanometer Complementary metal-oxide-semiconductor (CMOS) designs, the sigma-delta ADCs are commonly used in infrastructure wideband radio receivers. In general, sigma-delta ADCs has a loop filter which comprises (a series of) one or more operational amplifier (opamp) integrators, where each opamp integrator may have a resister at the input, an opamp, and a capacitor in a feedback path. An Nth order sigma-delta ADCs can have N stages of opamp integrators in the loop filter arranged to generate an output for a coarse analog-to-digital converter to generate a pulse train. The pulse train is then provided to a digital-to-analog converter in a feedback path back to the loop filter to as an input. If the coarse ADC produces a 1-Bit digital output pulse train, the digital output is typically provided to a digital filter and a decimator to produce a multi-bit digital output.

The efficiency of a continuous-time sigma-delta modulator is a function of the signal gain of the stages in the loop filter. In designing continuous time sigma-delta (CTSD) ADCs, one of the design goals is to reduce integrator output swing for a given integrator gain, so that the amplifier distortion is smaller and the current consumption is lower. Topologies with beneficial characteristics such as desirable signal transfer functions (STF) are typically afflicted with low signal gain in the front-end stages, thereby limiting their efficiency. The low signal gain is a result of large swing at the integrator outputs which must be scaled to fit within the swing limitations of the employed circuitry. If the signal swing can be reduced without affecting the signal transfer function (STF), then the loop filter maintains the desirable properties while increasing efficiency. The integrator output swing is determined by coefficients' scaling and supply voltage headroom. When the integrator is scaled for smaller swing, the integrator's AC gain is also reduced. Such an implementation may result in large noise contribution from the following stages of opamp integrators. If the unscaled output swing of an integrator stage can be reduced, its signal gain after scaling will be increased. Thus, it is desirable to reduce opamp output swing without significantly affecting the STF and/or compromising noise performance.

OVERVIEW

The present disclosure relates generally to an apparatus and a method for reducing integrator output swing in a loop filter suitable for a continuous-time sigma-delta analog-to-digital converter. The loop filter is configured to filter an analog input $V_{in}$, and the loop filter includes a series of opamp integrators. The input to the series of opamp integrators is $V_{in}$, and one or more outputs of the opamp integrators is provided to an analog-to-digital converter to produce a digital output $d_{OUT}$. In particular, the loop filter includes one or more feedback paths for reducing integrator output swing. In one (capacitively-coupled) feedback path, a first feedback voltage output digital-to-analog converter $V_{DAC2}$ has $d_{OUT}$ as input and a voltage output connected, through a first capacitor $C_{DAC2}$, to the input node of a first opamp in the series of opamp integrators.

The first feedback voltage output digital-to-analog converter $V_{DAC2}$ advantageously provides signal content via a feedback path to cancel out substantially all of the signal content at the output node of the first opamp. By reducing the signal content at the output node, the unscaled output swing may be effectively reduced for the first opamp, allowing its gain to be increased, thereby improving the efficiency of the system. By using a feedback path instead of a feedforward path which uses $v_{IN}$ directly, the signal transfer function is not affected as severely when compared to systems where a feedforward path is used to cancel the signal content. More flexibility is available to using a feedback path, and allows the system to meet more stringent signal transfer function requirements.

The capacitive DAC, $V_{DAC2}$, may be used in conjunction with a second feedback current output digital-to-analog converter $I_{DAC2}$ having $d_{OUT}$ as input and a current output connected to the input node of a second opamp in the series of opamp integrators. $I_{DAC2}$ may be configured to draw current to assist the first opamp and the amount of current $I_{DAC2}$ draws is based on $V_{IN}$ and $d_{OUT}$. $V_{DAC2}$ and $I_{DAC2}$ may then work jointly reduce the net current flowing into the input node of the second opamp and/or the output node of the first opamp. Such a configuration having both the capacitive DAC and the current output DAC may be balanced to achieve reduced output swing for a given input profile (e.g., based on the bandwidth and frequency of the input).

In some embodiments, the current output DAC may be substantially removed or the function of the current output DAC may be significantly replaced by the capacitively-coupled voltage output DAC. Specifically, the capacitively-coupled voltage output DAC, $V_{DAC2}$, may generate a voltage $V_{DAC2@out1}$ through the capacitor $C_{DAC2}$ and a feedback capacitor $C_1$ of the first opamp integrator at the output node of the first opamp to provide an equivalent voltage to reduce the current flowing into the input node of the second opamp.

In some embodiments, $V_{DAC2}$ is configured to substantially remove the function of $I_{DAC2}$ by providing an equivalent voltage that is determined based on the current that is otherwise drawn by $I_{DAC2}$ and the resistance of the resistor $R_2$ between the output node of the first opamp and the input node of the second opamp. For instance, suppose the first opamp integrator has a feedback capacitor $C_1$, the equivalent voltage may be provided by selecting $C_{DAC2}$ based on $-I_{DAC2} \times C_1 \times R_2/V_{DAC2}$.

In some embodiments, a second capacitor $-C_{DAC2}$ connected to the output of $V_{DAC2}$ and the output node of the first opamp. The additional capacitor advantageously assists the first opamp with the transient response needed by the capacitive DAC, i.e., $V_{DAC2}$ by providing sufficient charge needed at the output node of the first opamp due to the action of $V_{DAC2}$.

DESCRIPTION OF EXAMPLE EMBODIMENTS OF THE DISCLOSURE

Sigma-delta modulators are widely used for analog-to-digital converters (ADCs) in audio and high precision instrumentation systems, or any application where a high data resolution is desired. Sigma-delta modulators is a key part in the ADC for sampling an analog input $v_{IN}$ with high power efficiency and low noise. The sigma-delta modulator has a two-input loop filter and a coarse ADC (e.g., 1-Bit ADC, and may be commonly referred to as a quantizer). The loop filter takes the analog input $v_{IN}$ as one of the inputs and produces a digital output $d_{OUT}$ (e.g., a pulse train). $d_{OUT}$ is then provided in a feedback path to the loop filter as the other one of the inputs of the loop filter. In some cases, $d_{OUT}$ is provided to a digital filter and/or a decimator to produce a multi-bit output. The loop filter may have one or more integrators (also referred to as integrator stages). An Nth order loop filter may have N number of integrator stages, wherein each integrator stage comprises a resistor at the input node of an opamp, the opamp, and a feedback capacitor connecting the output node of the opamp to the input node of the opamp (for continuous-time sigma-delta loop filters). A loop filter of a higher order generally provide a greater noise shaping effect when compared to a loop filter with a lower order, e.g., which achieves lower overall noise if a low pass filter is provided to filter out the noise in the digital domain. Feedback DACs are connected to some or all of the integrator stages. Modulators with feedback DACs connected to each integrator are called 'feedback modulators' while those with a single DAC at the 1$^{st}$ integrator are called feedforward modulators (as they use feedforward path to replace the other DACs). There can also exist hybrid modulators which replaced only some of the DACs beyond the 1$^{st}$ with feedforward paths. This technique could be applied to feedback and hybrid modulators as it is a modification of DAC paths beyond the 1$^{st}$ integrator.

Figure 1:
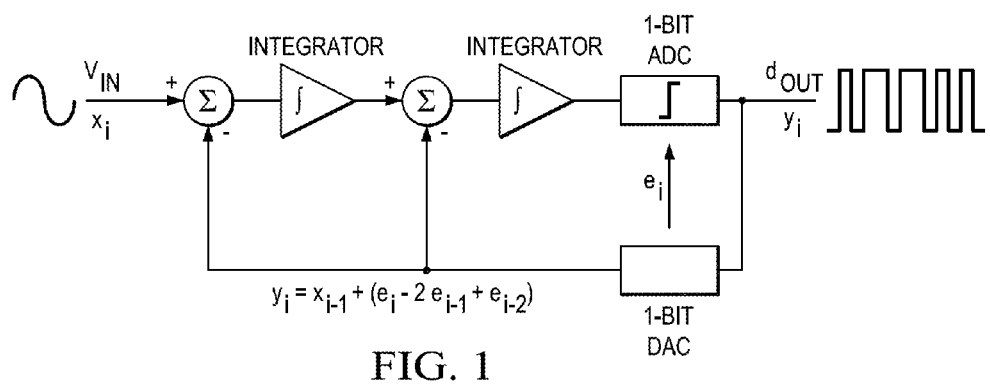
FIG. 1 is a simplified schematic diagram illustrating an exemplary second-order sigma-delta modulator.

FIG. 1 is a simplified schematic diagram illustrating an exemplary second-order sigma-delta modulator, which includes two integrator stages. The analog input (illustrated by a sinusoid, labeled $x_i$) is provided as an input to a loop filter having a series of integrators (in this case, two integrators). One or more outputs of the integrators is provided towards an illustrative 1-Bit ADC (a coarse ADC) to produce a digital output $d_{OUT}$ (illustrated by the pulse train, labeled $y_i$). Different configurations are available for providing the one or more outputs of the integrators to the ADC. In some cases, the one or more outputs are combined/summed and the combined/summed output is provided as input to the ADC. In some cases, a subset of the outputs (e.g., the output of the last integrator in the series of integrator stages) are provided as input to the ADC. In some other cases, a derivation of one or more of the outputs are provided as input to the ADC. The digital output $d_{OUT}$ is provided in feedback paths to difference modules (illustrated by the Σ) to each integrator stage. For illustration, the disclosure discusses methods and systems for reducing the output swing of the first integrator stage. However, it is envisioned that the same methods and systems may be replicated for one or more subsequent integrator stages as well to reduce the output swing of the integrator stages.

One way to reduce the output swing of an integrator stage is by having a feedforward path to provide the loop filter input $v_{IN}$ at the delta module of the second integrator stage. The signal content from $v_{IN}$ partially cancels the feedback DAC signal connecting to the same second integrator stage. The output swing is forced to be smaller by the loop because the net input of the second integrator stage should be close to zero (in-band). One issue with such an implementation is that the feedforward path using the loop filter input $v_{IN}$ affects the signal transfer function (STF) because of the extra signal path from $v_{IN}$. The effect on the STF is usually more sever to out-of-band response and may result in large peaking. While a sharp filter at the front of the sigma-delta ADC may be used to alleviate the issue, for cost reasons, such a sharp filter may not be used. Many systems may only have minimal front-end filtering before the sigma-delta ADC, or do not have any filtering at all for continuous-time sigma-delta ADCs. An ADC with STF peaking could be easily saturated by large out-of-band signals. Such a design is not very suitable for systems where stringent STF requirements exists.

Some loop filters use current output DAC feedback paths. It has been discovered by the inventors that when these current output DAC feedback paths are replaced by equivalent capacitively-coupled voltage DACs, the resulting system may have a reduction of the signal content at the output of the integrators in the modulator such that the signal gain can be increased to improve modulator efficiency. By using a feedback path to reduce integrator output swing instead of a signal path from $v_{IN}$, the STF of the loop filter is substantially preserved.

Figure 2:
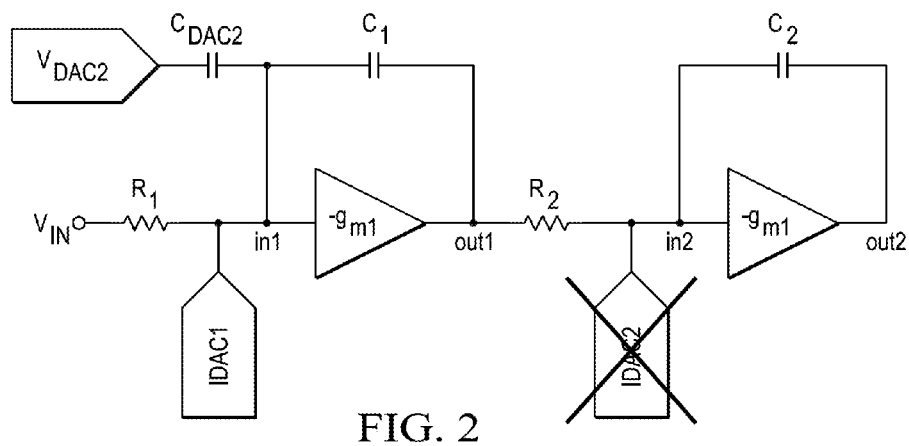
FIG. 2 is a simplified schematic diagram illustrating an exemplary loop filter for a sigma-delta modulator, according to some embodiments of the disclosure.

FIG. 2 is a simplified schematic diagram illustrating an exemplary loop filter for a sigma-delta modulator, according to some embodiments of the disclosure. The loop filter has an analog input $v_{IN}$. The loop filter has a first integrator stage and a second integrator stage. The first integrator stage comprises a resistor $R_1$, a first opamp denoted by "-$g_{m1}$" and a feedback path with a capacitor $C_1$. The input node to the first opamp is denoted by "in1" and the output node is denoted by "out1". The second integrator stage comprises a resistor $R_2$, a second opamp denoted by "-$g_{m2}$" and a feedback path with a capacitor $C_2$. The input node to the second opamp is denoted by "in2" and the output node is denoted by "out2".

Fundamentally, to preserve the signal transfer function and/or noise transfer functions, the flow of the signals from the inputs to the outputs of the loop filter must be substantially preserved. Thus, to minimize the swing on internal nodes of a loop filter, alternative signal paths which are equivalent at the output but different internally may be used. In some cases, one or more current output/mode feedback DACs may be provided at the input nodes of the integrator stages (denoted by "$I_{DAC1}$" and "$I_{DAC2}$") and a signal path using $v_{IN}$ would be provided to try and cancel the feedback signal current of these current output/mode feedback paths in an attempt to preserve the STF of the system. These current output/mode feedback DACs have $d_{OUT}$ as input and a current output connected to the input nodes of the opamps (e.g., $I_{DAC2}$ connected to the second opamp in the series of opamp integrators). At the input node of the second opamp, $I_{DAC2}$ may be configured to draw current to assist the first opamp and the amount of current $I_{DAC2}$ draws is based on $v_{IN}$ and $d_{OUT}$.

To preserve the signal transfer function and/or noise transfer functions in a different way, a capacitively-coupled voltage output/mode DAC path is provided (shown as "$V_{DAC2}$"). $V_{DAC2}$ is coupled to the input node in1 through a capacitor $C_{DAC2}$ to perform at least part of the function (otherwise) served by $I_{DAC2}$. Specifically, the solution provides a first feedback voltage output digital-to-analog converter $V_{DAC2}$ having $d_{OUT}$ as input and a voltage output connected, through a first capacitor $C_{DAC2}$, to the input node of a first opamp in the series of opamp integrators. The advantageous effect of providing the capacitively-coupled voltage output feedback path is the reduction of net signal current (to substantially zero) flowing on the in2 node from other sources, and causing a reduction of current (to substantially zero) flowing from out1. Effectively, the output swing is reduced because the signal content would be substantially reduced at the output node of the first integrator stage.

In some cases, the function and/or existence of $I_{DAC2}$ is removed substantially completely. The proposed alternative path effectively converts some or all of the current mode/output DACs (e.g., $I_{DAC2}$ and so forth in subsequent integrator stage(s)) to voltage mode/output DACs. A capacitively-coupled voltage output DAC can be attached to the previous stage which is equivalent to the current output DAC attached to the following stage because the resistor (e.g., $R_2$) connecting the previous stage to the following stage (e.g., connecting the first opamp and the second opamp) acts as a voltage-to-current converter. By applying an equivalent voltage at the output node of the first opamp using $V_{DAC2}$, the signal voltage no longer appears because the signal voltage at the output node of the first opamp effectively served to cancel the signal current drawn by $I_{DAC2}$ of at the input node of the second opamp. The current flowing into the input node of the second opamp is effectively reduced.

The equivalent function of $I_{DAC2}$ can be computed/determined based on the current otherwise drawn by $I_{DAC2}$ and the resistance of $R_2$. Specifically, $V_{DAC2}$ may generate a voltage $V_{DAC2@out1}$ through the capacitor $C_{DAC2}$ and $C_1$ to provide the equivalent voltage in replacing the $I_{DAC2}$. The calculation for equivalence may follow the following:

$$V_{DAC2@out1} = I_{DAC2} \times R_2 = V_{DAC2} \times (-C_{DAC2}/C_1) \quad (1)$$

The above equation may be rearranged algebraically to find capacitance $C_{DAC2}$ for the voltage mode/output feedback DAC path:

$$C_{DAC2} = I_{DAC2} \times C_1 \times R_2 / V_{DAC2} \quad (2)$$

By configuring a proper capacitor, e.g., $C_{DAC2}$, for the voltage output feedback DAC path, the current output feedback DAC path may be substantially or completely eliminated. In one instance, for a fourth order low-pass feedback modulator where current DACs 2-4 (i.e., current output feedback DACs connected at input nodes of the opamps in the second, third, and fourth integrator stages) are substantially replaced by capacitively-coupled voltage output feedback DACs (e.g., $V_{DAC2}, V_{DAC3}, V_{DAC4}$) is tested. It was found that the signal content at direct current (DC) at the output nodes of the opamps is substantially eliminated. The opamp integrator output swing reduction at higher frequencies is also reduced in later integrator stages, where the signal content in the voltage output feedback DAC path is increasingly phase-aligned with the signal content that is present at the output nodes of these later integrator stages. However, at the first opamp, the added signal content from the voltage output feedback DAC path may add constructively, in some cases, with the existing signal content at the output of the first opamp at higher frequencies, which may cause a less substantial reduction in output swing for the output node of the second opamp.

To alleviate the issue, a loop filter may provide the current output feedback DACs (e.g., by not replacing the IDAC2-4 completely) together with the voltage output feedback DACs together to jointly reduce the net current flowing into the input node of next integrator stage (e.g., the second opamp onwards), and at the output nodes of the opamps in the previous integrator stages.

An optimal balance can be determined between the current output and voltage output feedback DACs which results in substantially minimized peak swing for a given input profile. If the capacitively-coupled voltage output feedback DAC is configured according to equations (1) and (2), then the current output feedback DAC is completely replaced by the capacitively-coupled voltage output feedback DAC. The current output feedback DAC, in some cases, can be removed. The equations (1) and (2) allows the capacitively-coupled voltage feedback DAC to perform the function of the current output DAC. In some embodiments, the capacitively-coupled voltage output feedback DAC could instead be configured with a capacitor $C_{DAC2}$ somewhere between zero and the number computed using equation (2). In these embodiments, of the current output feedback DACs may still be used to provide some function in reducing output swing. The allocation between the capacitively-coupled voltage output DAC and the current output feedback DAC may be optimized when both are used to reduce output swing. Test results for a fourth order continuous-time loop filter have shown reductions of 25% in the output swing at the output node of the first opamp, a reduction of 41% in the output swing at the output node of the second opamp, and a reduction of 56% in the output swing at the output node of the third opamp. These benefits in the scaling of later integrator stages may also be present and beneficial in low oversampling ratio (low-OSR) feedback modulators where the later integrator stages can contribute significantly to input-referred noise and distortion. Besides feedback modulators, it could also be applied to hybrid feedforward/feedback modulators as described previously.

The allocation between the capacitively-coupled voltage output feedback DAC and the current output feedback DAC may be determined empirically with number-crunching software. For instance, a numerical algorithm may be performed to optimize for one or more target goals. An example target goal may be to minimize the worst-case swing for a particular range of frequencies, or for a particular input profile. In one instance, a target goal may be to minimize the worst-case swing over frequency. When only current output feedback DACs are used, the swings are largest at lower frequencies, but when only capacitively-coupled voltage output feedback DACs are used, the swings are largest at higher frequencies. In the optimized design where both current output feedback DACs and the capacitively-coupled voltage output feedback DACs are used where the allocation is empirically determined, the results exhibits the lowest worst-case swing for both lower and higher frequencies.

Figure 3:
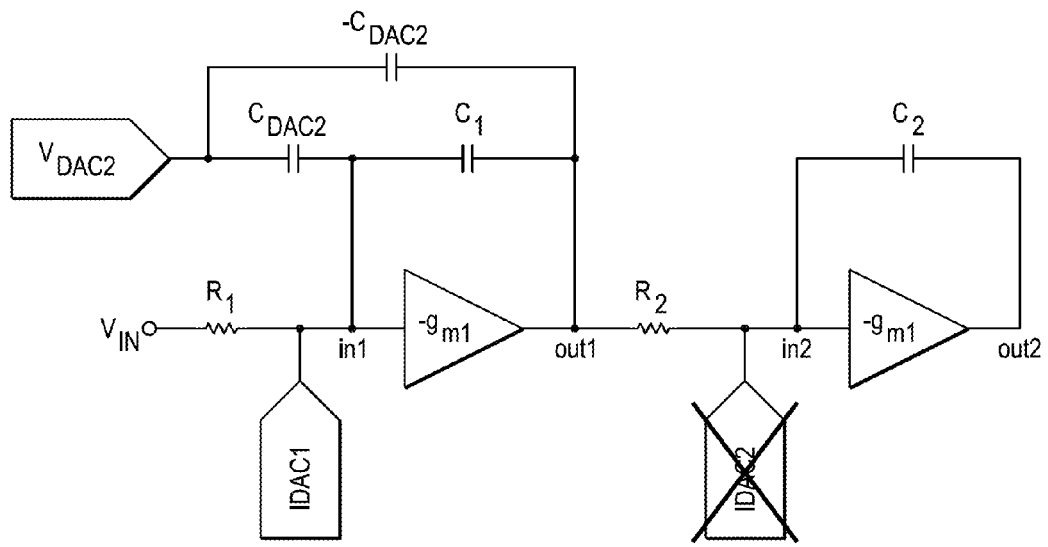
FIG. 3 is a simplified schematic diagram illustrating another exemplary loop filter for a sigma-delta modulator, according to some embodiments of the disclosure.

FIG. 3 is a simplified schematic diagram illustrating another exemplary loop filter for a sigma-delta modulator, according to some embodiments of the disclosure. To further improve on the system shown in FIG. 2, an additional capacitor $-C_{DAC2}$ may be added to assist the amplifier by providing the required current for the capacitive DAC to the amplifier output rather than requiring the amplifier to provide it. In this example, the second capacitor, denoted as $-C_{DAC2}$, is connected to the output of $V_{DAC2}$ and the output node of the first opamp. The configuration of the additional capacitor provides an assisting function for helping the opamp with the transient response required by the capacitively-coupled voltage output feedback DAC. By providing the charge needed at output node of the first amplifier out1 due to the action of $V_{DAC2}$ directly with the capacitor $-C_{DAC2}$, the current-driving requirements of the first opamp can be reduced. In some embodiments, the current output feedback DACs may be used as well to provide an optimized allocation between the voltage output feedback DACs and the current output feedback DACs. In some embodiments, the current output feedback DACs are not used or are eliminated, or their function is substantially reduced or diminished.

Figure 4:
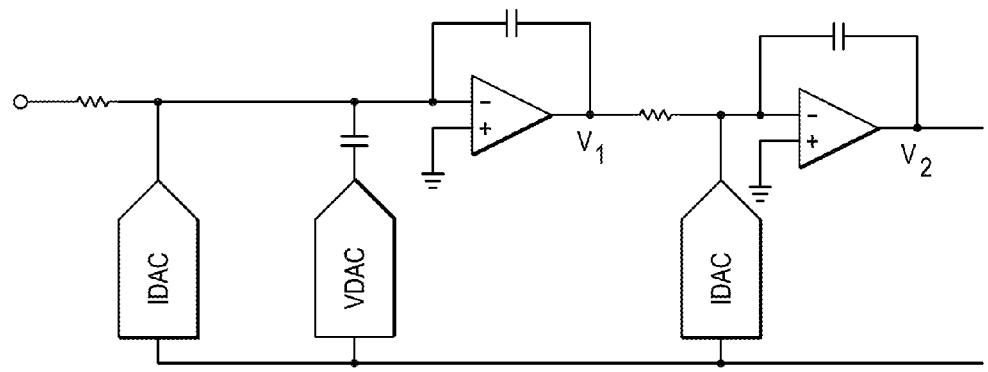
FIG. 4 is a simplified circuit diagram illustrating an exemplary loop filter for a sigma-delta modulator, according to some embodiments of the disclosure.
Figure 5:
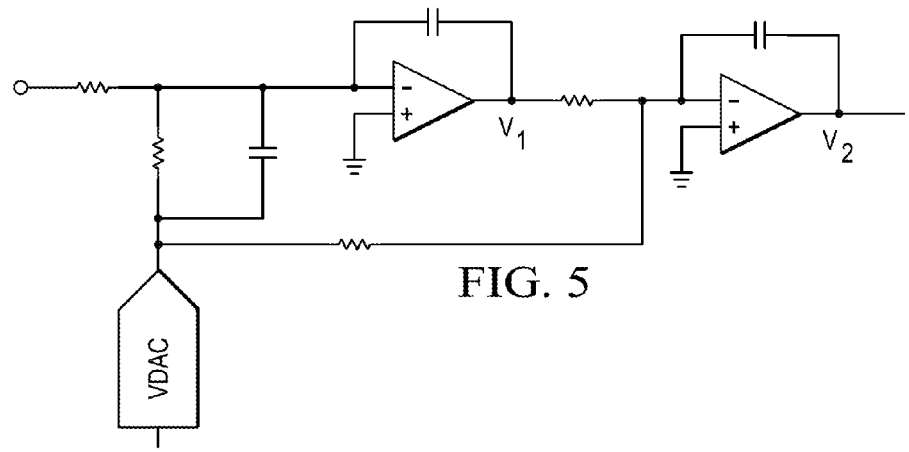
FIG. 5 is a simplified circuit diagram illustrating another exemplary loop filter for a sigma-delta modulator, according to some embodiments of the disclosure.

Simplifications to the system design may be available when the current output feedback DACs is replaced by (or its function being substantially carried out by) a voltage output feedback DAC. In some embodiments, the loop filter comprises a separate current output feedback DAC (denoted as IDAC) and a separate voltage output feedback DAC (denoted as VDAC) for supplying the feedback DAC paths to the loop filter, as seen in FIG. 4. It is noted that a VDAC in series with a resistor would provide the same function as an equivalent IDAC. Thus, in certain embodiments, the loop filter may use the same VDAC to provide the voltage output feedback DAC and the current output feedback DAC. FIG. 5 shows an embodiment where the VDAC is further configured as the feedback current output DAC by connecting the output of the VDAC in series with a suitable resistor to one of the input nodes of the opamps in the series of opamp integrators.

These designs may be particularly suitable for sigma-delta ADCs, especially ones used for input profiles with a wide bandwidth, where the benefits of reduced output swing and higher signal gain can be leveraged over a wide range of frequencies. Radio applications in particular often have blocker tolerance requirements that require the ADC to tolerate large signals at frequencies outside the desired bandwidth. This may push designs towards feedback modulators because of their superior blocker tolerance. Meanwhile sample rate limits and bandwidth demands push towards a design to have a lower OSR. Unfortunately these choices are not power efficient, but the techniques disclosed herein (most beneficial to low-OSR feedback modulators) can help.

In the discussions of the embodiments above, the opamps, DACs, ADCs capacitors, clocks, DFFs, dividers, inductors, resistors, amplifiers, switches, digital core, transistors, and/or other components usable for these circuits can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, particularly those that can execute digital filtering for ADCs. In some cases, the integrated circuits may be configured to execute specialized software programs, or algorithms, some of which may be associated with processing digitized real-time data. Certain embodiments can relate to multi-DSP signal processing, floating point processing, signal/control processing, fixed-function processing, microcontroller applications, etc.

In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets where ADCs are used. Other consumer applications can include audio and video processors for home theater systems, DVD recorders, and high-definition televisions. Other audio and high precision instrumentation systems are envisioned.

Note that with the numerous examples provided herein, interaction may be described in terms of two, three, four, or more electrical components. However, this has been done for purposes of clarity and example only. It should be appreciated that the system can be consolidated in any suitable manner.

Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES, EXAMPLES, AND IMPLEMENTATIONS

Note that all optional features of the apparatus described above may also be implemented with respect to the method or process described herein and specifics in the examples may be used anywhere in one or more embodiments.

In a first example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The system can include means for clocking, e.g., to sample analog data to provide digital data. The digital data may then be provided the digital core onto a first data output of a macro using a first clock, the first clock being a macro clock; means for clocking the data from the first data output of the macro into the physical interface using a second clock, the second clock being a physical interface clock; means for clocking a first reset signal from the digital core onto a reset output of the macro using the macro clock, the first reset signal output used as a second reset signal; means for sampling the second reset signal using a third clock, which provides a clock rate greater than the rate of the second clock, to generate a sampled reset signal; and means for resetting the second clock to a predetermined state in the physical interface in response to a transition of the sampled reset signal.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:

1. A continuous-time sigma-delta loop filter for filtering an analog input $V_{IN}$, the loop filter comprising:
   a series of opamp integrators, wherein the input to the series of opamp integrators is $v_{IN}$ and one or more outputs of the opamp integrators are provided towards an analog-to-digital converter to produce a digital output $d_{OUT}$; and
   a first feedback voltage output digital-to-analog converter $V_{DAC2}$ having $d_{OUT}$ as input and a voltage output connected, through a first capacitor $C_{DAC2}$, to the input node of a first opamp in the series of opamp integrators;
   wherein:
   $V_{DAC2}$ is configured to remove a part of the function of a second feedback current output digital-to-analog converter $I_{DAC2}$ having $d_{OUT}$ as input and a current output connected to the input node of a second opamp in the series of opamp integrators; and
   $C_{DAC2}$ is determined to provide an equivalent voltage at the output of first opamp based on the current that is no longer drawn by $I_{DAC2}$, the resistance of a resistor $R_2$ between the output node of the first opamp and the input node of the second opamp, and a feedback capacitor $C_1$ of the first opamp integrator.

2. The loop filter of claim 1, wherein:
   $V_{DAC2}$ is configured to substantially cancel the signal content at the output node of the first opamp to reduce the output swing of the first opamp.

3. The loop filter of claim 1, wherein:
   $V_{DAC2}$ generates a voltage $V_{DAC2@out1}$ through the capacitor $C_{DAC2}$ and the feedback capacitor $C_1$ of the first opamp integrator at the output node of the first opamp to provide the equivalent voltage to reduce the current flowing into the input node of the second opamp.

4. The loop filter of claim 1, further comprising:
   a second capacitor $-C_{DAC2}$ connected from the output of $V_{DAC2}$ to the output node of the first opamp to help the first opamp with a transient response required by $V_{DAC2}$.

5. The loop filter of claim 1, further comprising:
   wherein $I_{DAC2}$ is configured to draw current to assist the first opamp and the amount of current $I_{DAC2}$ draws is based on $v_{IN}$ and $d_{OUT}$ such that operation of $I_{DAC2}$ in conjunction with $V_{DAC2}$ provides sufficient feedback content based on $d_{OUT}$.

6. The loop filter of claim 5, wherein:
   $V_{DAC2}$ and $I_{DAC2}$ jointly reduce the net current flowing into the input node of the second opamp and/or at the output node of the first opamp.

7. The loop filter of claim 1, wherein:
   the equivalent voltage is provided by selecting $C_{DAC2}$ based on:
   $-I_{DAC2} \times C_1 \times R_2 / V_{DAC2}$.

8. The loop filter according to claim 1, further comprising:
   the $V_{DAC2}$ is further configured as a feedback current output digital-to-analog converter $I_{DAC}$ by connecting the output of the $V_{DAC2}$ in series with a resistor to one of the input nodes of the opamps in the series of opamp integrators.

9. A continuous time sigma-delta analog-to-digital converter, the converter comprising:
a loop filter comprising:
a series of opamp integrators, wherein the input to the series of opamp integrators is $V_{IN}$; and
an analog-to-digital converter to produce a digital output $d_{OUT}$ from one or more outputs of opamp integrators;
the loop filter further comprises:
a first feedback voltage output digital-to-analog converter $V_{DAC2}$ having $d_{OUT}$ as input and a voltage output connected, through a first capacitor $C_{DAC2}$, to the input node of a first opamp in the series of opamp integrators;
wherein:
$V_{DAC2}$ is configured to remove a part of the function of a second feedback current output digital-to-analog converter $I_{DAC2}$ having $d_{OUT}$ as input and a current output connected to the input node of a second opamp in the series of opamp integrators; and
$C_{DAC2}$ is determined to provide an equivalent voltage at the output of first opamp based on the current that is no longer drawn by $I_{DAC2}$, the resistance of a resistor $R_2$ between the output node of the first opamp and the input node of the second opamp, and a feedback capacitor $C_1$ of the first opamp integrator.

10. The converter according to claim 9, wherein the loop filter further comprises:
wherein $I_{DAC2}$ is configured to draw current to assist the first opamp and the amount of current $I_{DAC2}$ draws is based on $v_{IN}$ and $d_{OUT}$ such that operation of $I_{DAC2}$ in conjunction with $V_{DAC2}$ provides sufficient feedback content based on $d_{OUT}$.

11. A method for reducing integrator output swing in a continuous-time sigma-delta loop filter, the method comprising:
providing an analog input $v_{IN}$ to a series of opamp integrators;
providing one or more outputs of the opamp integrators towards an analog-to-digital converter to produce a digital output $d_{OUT}$;
providing $d_{OUT}$ as input to a first feedback voltage output digital-to-analog converter $V_{DAC2}$;
providing the voltage output of $V_{DAC2}$ through a first capacitor $C_{DAC2}$ to the input node of a first opamp in the series of opamp integrators;
removing, using $V_{DAC2}$, a part of the function of a second feedback current output digital-to-analog converter $I_{DAC2}$ having $d_{OUT}$ as input and a current output connected to the input node of a second opamp in the series of opamp integrators; and
determining $C_{DAC2}$ to provide an equivalent voltage at the output of first opamp based on the current that is no longer drawn by $I_{DAC2}$, the resistance of a resistor $R_2$ between the output node of the first opamp and the input node of the second opamp, and a feedback capacitor $C_1$ of the first opamp integrator.

12. The method of claim 11, wherein:
substantially cancelling the signal content at the output of the first opamp using $V_{DAC2}$ to reduce the output swing of the first opamp.

13. The method of claim 11, further comprising:
providing a second capacitor $-C_{DAC2}$ connected from the output of $V_{DAC2}$ to the output node of the first opamp to help the first opamp with a transient response required by $V_{DAC2}$.

14. The method of claim 11, further comprising:
wherein $I_{DAC2}$ is configured to draw current to assist the first opamp and the amount of current $I_{DAC2}$ draws is based on $v_{IN}$ and $d_{OUT}$ such that operation of $I_{DAC2}$ in conjunction with $V_{DAC2}$ provides sufficient feedback content based on $d_{OUT}$.

15. The method of claim 14, further comprising:
reducing, using $V_{DAC2}$ and $I_{DAC2}$ together, the net current flowing into the input node of the second opamp and/or at the output node of the first opamp.

16. The method of claim 14, further comprising:
generating, using $V_{DAC2}$, a voltage $V_{DAC2@out1}$ through the capacitor $C_{DAC2}$ and the feedback capacitor $C_1$ of the first opamp integrator at the output of the first opamp to provide the equivalent voltage to reduce the current flowing into the input node of the second opamp.

17. The method of claim 11, wherein:
the method further comprising selecting $C_{DAC2}$, to provide the equivalent voltage, based on $-I_{DAC2} \times C_1 \times R_2 / V_{DAC2}$.

18. The method of claim 14, further comprising:
providing the output of the $V_{DAC2}$ in series with a resistor to one or more input nodes of the opamps in the series of opamp integrators as a feedback current output digital-to-analog converter $I_{DAC}$.

19. A continuous-time sigma-delta loop filter for filtering an analog input $V_{IN}$, the loop filter comprising:
a series of opamp integrators, wherein the input to the series of opamp integrators is $v_{IN}$ and one or more outputs of the opamp integrators are provided towards an analog-to-digital converter to produce a digital output $d_{OUT}$;
a first feedback voltage output digital-to-analog converter $V_{DAC2}$ having $d_{OUT}$ as input and a voltage output connected, through a first capacitor $C_{DAC2}$, to the input node of a first opamp in the series of opamp integrators; and
a second capacitor $-C_{DAC2}$ connected from the output of $V_{DAC2}$ to the output node of the first opamp to provide charge to the output of the first opamp.

* * * * *